United States Patent [19]

Malone

[11] 4,237,374
[45] Dec. 2, 1980

[54] COUNTING SYSTEM FOR COUNTING NEWSPAPERS OR THE LIKE

[76] Inventor: Douglas J. Malone, 1917 Pullman La., Redondo Beach, Calif. 90278

[21] Appl. No.: 30,296

[22] Filed: Apr. 16, 1979

[51] Int. Cl.³ .................. H03K 21/06; G06M 3/12
[52] U.S. Cl. ......................... 235/92 SB; 235/92 PK
[58] Field of Search ......... 235/92 SB, 92 PK, 92 MP, 235/98 R, 98 A

[56] References Cited

U.S. PATENT DOCUMENTS

| 3,702,925 | 11/1972 | Anderson et al. | 235/92 SB |
| 3,737,666 | 6/1973 | Dutro | 235/92 PK |

Primary Examiner—Joseph M. Thesz
Attorney, Agent, or Firm—Edward A. Sokoski

[57] ABSTRACT

A cutting cylinder of a newspaper press assembly has a magnet member mounted thereon. A semiconductor Hall effect pickoff is mounted in proximity to the cutting cylinder such that the magnet passes by this sensor in close proximity thereto once during each rotation of the cylinder. The output of the Hall effect sensor, which is in the form of pulses, is fed both to a non-inverting and an inverting amplifier. The outputs of the amplifiers are fed to a differential detector which provides an output only in accordance with the difference between the inputs fed thereto, thus eliminating common-mode inputs such as noise signals. The output of the differential detector is fed to a digital counter which provides a count of the input pulses representing the number of newspapers or the like detected by the sensor. The output of the digital counter in turn is fed to a readout device which provides a suitable readout of this count which may be in the form of a display.

5 Claims, 3 Drawing Figures

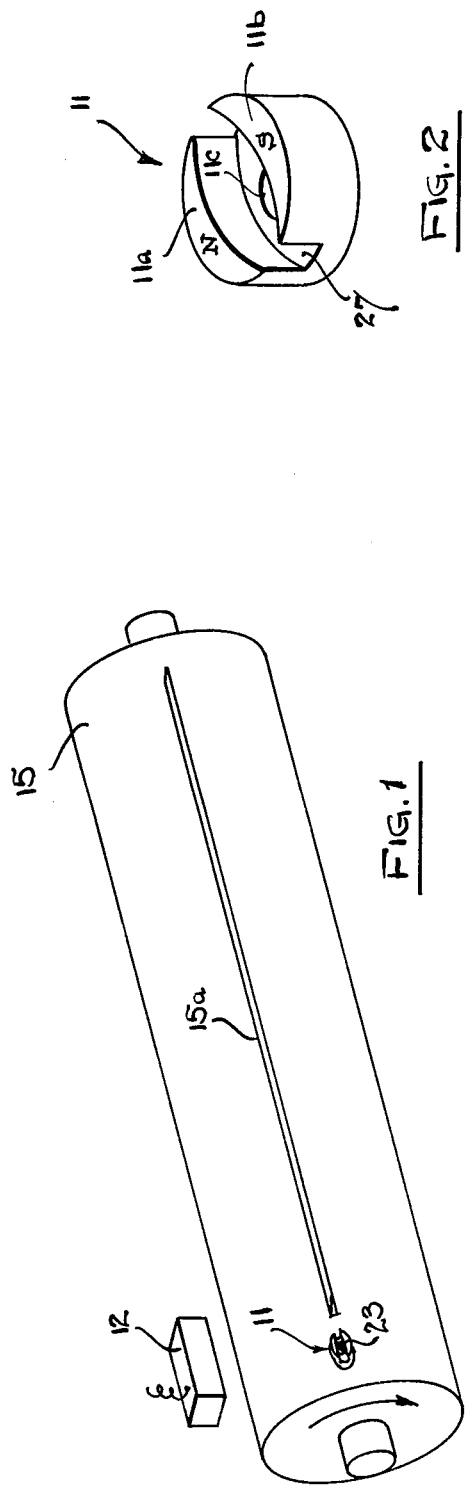
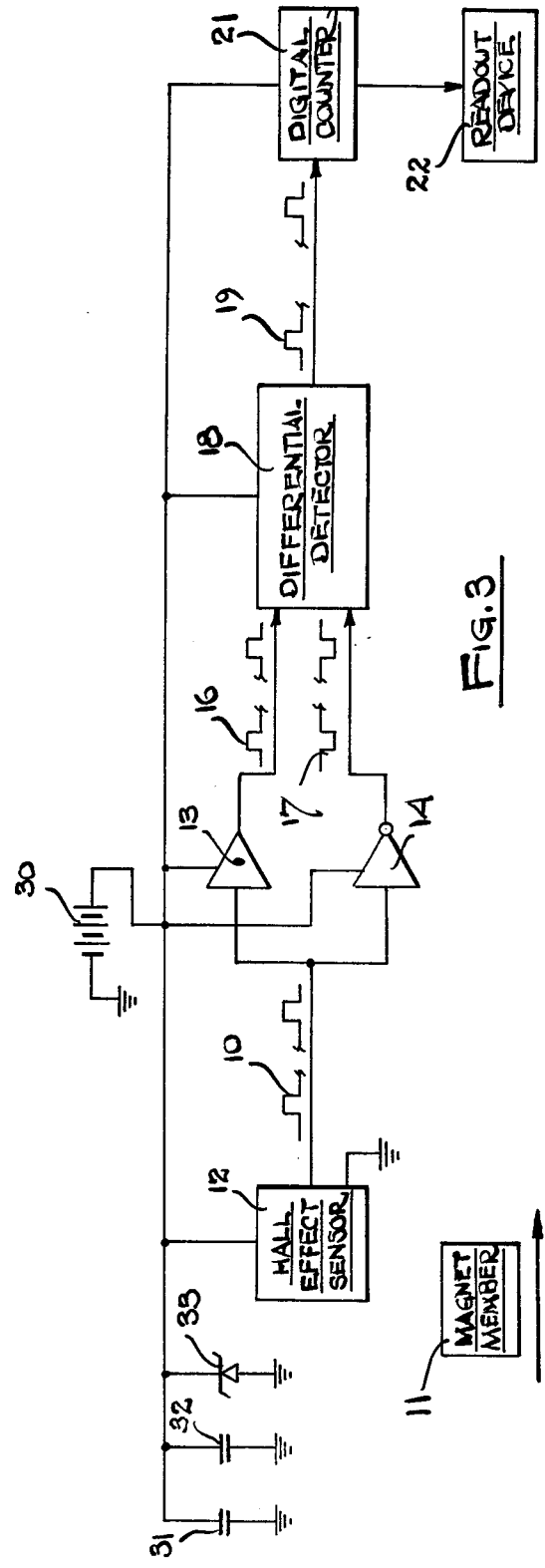

COUNTING SYSTEM FOR COUNTING NEWSPAPERS OR THE LIKE

This invention relates to counting systems and more particularly to such a system suitable for counting newspapers or other publications as they come off a printing press assembly.

As newspapers or other publications come off the printing press, means are generally provided to count the number of such publications so that the printing can be appropriately controlled to provide the number of copies desired. Most counters used for this purpose are mechanical in nature, employing rotating gears. This type of mechanism has the disadvantage of tending to wear out rather rapidly, and thus requires a significant amount of maintenance. Some newspaper counters, such as described in U.S. Pat. No. 3,571,574, issued on Mar. 23, 1971, to W. Gerber, employ an electromechanical implementation having a feeler gauge which comes into contact with each of the newspapers as they are passing along a conveyor, an electrical pulse which is appropriately processed and counted being generated for each such newspaper. This type of feeler gauge mechanism, in view of its mechanical implementation, has the same maintenance problem as other mechanical devices. Counting systems have also been developed in the prior art for use in counting paper sheets which employ photoelectric pickoffs. Such systems are described in U.S. Pat. Nos. 3,870,868 and 4,015,110, issued on Mar. 11, 1975, and Mar. 29, 1977, respectively, to A. Jones. This type of photoelectric system, while obviating the problems inherent in mechanical sensors, present a problem in paper counting operations in view of the large amount of paper dust generated. This results in the light source and/or pickoff becoming covered with such dust in a short period of time, thus interfering with the proper operation of the photoelectric circuits. Other prior art systems employ magnetic pickup coils which operate in conjunction with a moving magnet. These systems work quite well where there is relatively high relative motion between the pickup and the magnet. However, at low speeds, not enough voltage is included into the pickup to provide a proper output signal. Still other prior art systems employ magnetic reed relays which operate in conjunction with a moving magnet. Such relays are subject to contract "bounce" and have a somewhat limited life.

All of the above-mentioned systems (except for the purely mechanical one) are subject to false triggering in view of the electric transients generated by the large electric motors which run the printing presses.

The system of the present invention obviates the aforementioned shortcomings of the prior art in a fully electrically-electronically implemented system having no moving parts. Further, the system of the present invention is not significantly affected by paper dust in that it avoids the use of an optical implementation. Additionally, the sensor of the present invention can operate efficiently with a press running at relatively low speed in that the output of such sensor does not depend upon the relative speed between the rotating cylinder and the sensor. Further, the present system employs a differential detection system wherein noise generated by the press motors and other noise generation devices is effectively eliminated, thereby avoiding false triggering.

The improvement is achieved in the system of the present invention first by employing a Hall effect sensor, which is not dependent of relative velocity for its output, for sensing relative motion between the rotating press cylinder and the fixedly mounted sensor. A magnet is mounted on the rotating cylinder, this magnet passing in close proximity to the fixedly mounted Hall effect sensor, such that the sensor produces an output pulse each time the magnet passes in proximity thereto. The output of the Hall effect sensor is fed to both an inverting and non-inverting amplifier which provide a pair of signals in phase opposition to each other in response to each output of the sensor. The phase opposition signals are fed to the two inputs of a differential detector which is sensitive only to the difference between the two inputs and thus is not sensitive to random noise signals, the output of this detector being fed to a digital counter which in turn provides a digital count signal to a readout device.

It is therefore an object of this invention to provide an improved system for counting newspapers or other publications as they are fed from a printing press which system has not gears or other such moving parts, is capable of responding to slow-moving press cylinders, is not subject to paper dust, and is not affected by transient noise signals which may be generated by press motors and the like.

Other objects of this invention will become apparent as the description proceeds in connection with the accompanying drawings of which:

FIG. 1 is a schematic drawing illustrating the installation of the present invention in a printing press cutting cylinder;

FIG. 2 is a perspective drawing illustrating a magnet member which may be utilized in the sensing system of the invention; and FIG. 3 is a schematic drawing of a preferred embodiment of the invention.

Referring now to FIG. 1, the installation of the system of the invention on the rotating cutting cylinder of a typical printing press is illustrated. It is to be noted that the system can also be installed on a paper folder or other cylindrically moving portions of the press. Cylinder 15 has a cutting knife 15a installed thereon for cutting the sheets of a newspaper or magazine as the case may be. This cylinder rotates at speeds which may be low as 5-10 rpm, and with each such rotation cuts the papers which are then moved along on a conveyor belt (not shown). Fixedly mounted on cylinder 15 is a magnet 11, this being bolted onto the surface of the cylinder by means of a bolt 23. Fixedly mounted on a non-moving portion of the press (not shown) in close proximity to cylinder 15 is sensor device 12, the spacing between this sensor and magnet 11 being of the order of 1/16 inch when the magnet passes the sensor.

Magnet 11, as can be seen in FIG. 2, has north and south pole elements 11a and 11b which are separated from each other by an air gap 27. A hole 11c is provided in the base of the magnet through which bolt 23 passes in the mounting of the magnet on the rotating cylinder.

Sensor 12 is a Hall effect generator which is a semiconductor device providing an output each time magnet 11 passes in proximity thereto. This type of device, as is well known in the art, does not respond to the rate of change of the magnetic field, but rather to the presence of the magnetic field itself. Such Hall effect generators are described for use as sensor devices in U.S. Pat. No. 3,199,630, issued Aug. 10, 1965, to W. Engel et al., and U.S. Pat. No. 3,428,833, issued Feb. 18, 1969, to A. G. Chynoweth. Such devices are now commercially available from various manufacturers including Texas Instruments, a particular such device commercially available from Texas Instruments being part number TL170C, Silicon Hall Effect Switch.

Referring now to FIG. 3, a preferred embodiment of the system of the invention is schematically illustrated. Magnet member 11 passes in close proximity to Hall effect sensor 12. The output of the sensor 12 is a series of pulses 10, one for each passage of magnetic member 11 by the sensor. Pulses 10 are simultaneously fed to non-inverting amplifier 13 and inverting amplifier 14. The outputs of amplifiers 13 and 14 which are shown at 16 and 17 respectively are pulses in phase opposition relationship to each other. These pulses are fed to the differential inputs of differential detector 18. Differential detector 18 may be a commercially available differential line receiver, such as part no. SN75182N manufactured by Texas Instruments. Differential detector 18 is only responsive to the difference between the signals fed to its two inputs and thus does not respond to random noise signals which would tend to appear at the two inputs at the same amplitude and phase. Thus, such noise signals which might be developed by printing press motors and the like are effectively eliminated. The output of differential detector 18 is a series of pulses 19, each such pulse representing a single pass of magnet member 11 by Hall effect sensor 12. Pulses 19 are fed to digital counter 21 which may comprise a decade binary coded decimal counter which provides an output count in accordance with the pulses received thereby to readout device 22. The readout device may be any suitable display such as an LED display or a printout device.

Power is supplied to various components of the system from DC power source 30 which typically may have a 5-volt D.C. output. Filtering is provided by means of capacitors 31 and 32 and a zener diode is employed to limit transient voltages which may appear on the 5-volt D.C. supply line. Thus, with a 5-volt output from power supply 30, zener diode 33 is chosen to have a 6.2 volt conduction voltage.

The system of the invention thus provides a reliable count of the number of newspapers or other publications passing out of a rotary press and tends to be maintenance free over long periods of operation.

While the invention has been described and illustrated in detail, it is to be clearly understood that this is intended by way of illustration and example only and is not to be taken by way of limitation, the spirit and scope of this invention being limited only by the terms of the followng claims.

I claim:

1. A system for providing a count of the number of paper units passing through a moving member of a printing press or the like comprising
    a magnet member mounted on said moving member
    sensor means fixedly mounted adjacent to said moving member such that said magnet member passes by said sensor in close proximity thereto with the movement of said member, said sensor generating an output pulse each time said magnet member passes by said sensor,
    an inverting amplifier,
    a non-inverting amplifier,
    the pulse output of said sensor being simultaneously fed to said inverting and non-inverting amplifiers, said amplifiers thereby having pulse outputs in phase opposition with each other,
    a differential detector having a pair of inputs,
    the output of said inverting amplifier being fed to one of said differential detector inputs and the output of said non-inverting amplifier being fed to the other of said differential detector inputs, the output of said differential detector being a pulse signal which is in accordance with the difference between the inputs fed thereto,
    digital counter means for counting the pulse output of said differential detector and providing an output signal in accordance with such pulse count, and
    readout means responsive to the pulse count output of said digital counter means for providing a readout indicating the number of pulses counter by said counter means.

2. The system of claim 1 wherein said sensor is a Hall effect generator.

3. The system of claims 1 or 2 wherein said magnet member comprises a magnet having upstanding north and south pole portions positioned opposite each other with a gap therebetween, and means for attaching said magnet to the surface of said cylinder.

4. The system of claims 1 or 2 wherein said moving member is a rotating cylinder.

5. The system of claim 4 wherein said cylinder has a cutting knife thereon which operates to cut papers received at said cylinder to form said paper units.

* * * * *